(12) United States Patent
Schulz-Harder et al.

(10) Patent No.: US 6,345,437 B1
(45) Date of Patent: Feb. 12, 2002

(54) PROCESS FOR THE MANUFACTURING OF AN ARCHED METAL CERAMIC SUBSTRATUM

(75) Inventors: Jurgen Schulz-Harder, Lauf; Karl Exel, Rimbach/Odw, both of (DE)

(73) Assignee: Curamik Electronics GmbH (DE)

( * ) Notice: Subject to any disclaimer, the term of this patent is extended or adjusted under 35 U.S.C. 154(b) by 0 days.

(21) Appl. No.: 09/055,881

(22) Filed: Apr. 7, 1998

(30) Foreign Application Priority Data

Apr. 15, 1997 (DE) .......................................... 197 15 540

(51) Int. Cl.[7] .............................................. H01R 43/00
(52) U.S. Cl. .............................. 29/825; 29/829; 29/831; 29/842; 29/846; 29/848
(58) Field of Search .......................... 29/825, 571, 829, 29/831, 842, 846, 898; 264/56, 57, 58, 60, 62, 133; 156/89, 153, 325

(56) References Cited

U.S. PATENT DOCUMENTS

| | | | |
|---|---|---|---|
| 3,766,634 A | | 10/1973 | Babcock et al. |
| 4,346,512 A | * | 8/1982 | Liang et al. ............... 29/571 X |
| 4,399,089 A | * | 8/1983 | Mohri et al. ............... 264/57 X |
| 5,209,798 A | * | 5/1993 | Solomon et al. ......... 156/153 X |
| 5,236,786 A | * | 8/1993 | Newkirk et al. ......... 428/545 X |

FOREIGN PATENT DOCUMENTS

DE 3200034 C2 9/1986

* cited by examiner

Primary Examiner—Jessica J. Harrison
Assistant Examiner—Binh-An Nguyen
(74) Attorney, Agent, or Firm—Hoffman, Wasson & Gitler

(57) ABSTRACT

A process for manufacturing a metal ceramic substratum for use as a substrate in electrical or electronic circuits or components which includes utilizing an unique form mold process. At least one blank ceramic plate is shaped in a form mold through a desired set of process steps. The steps include heating and cooling to desired temperatures at desired heat and cool rates.

42 Claims, 8 Drawing Sheets

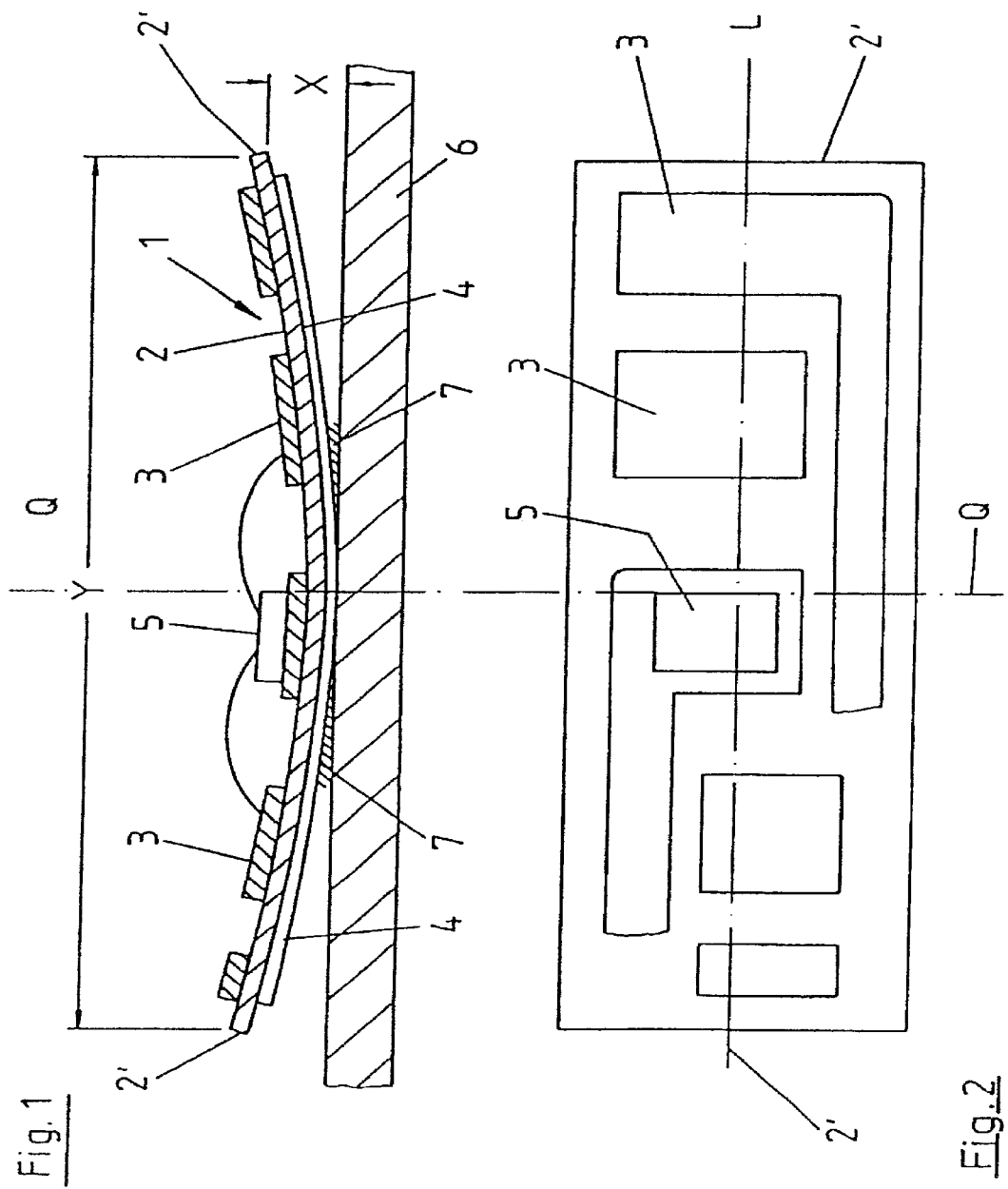

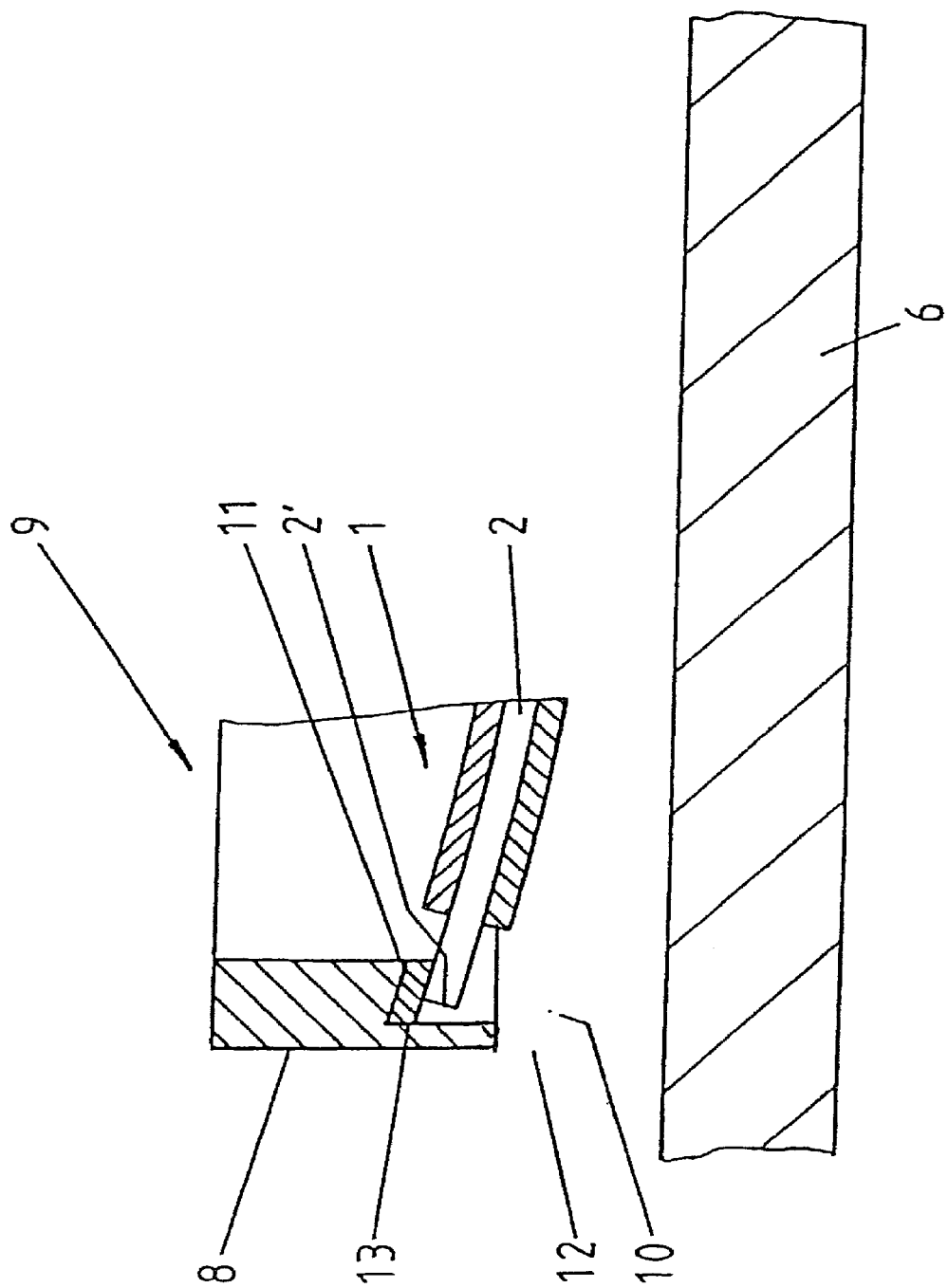

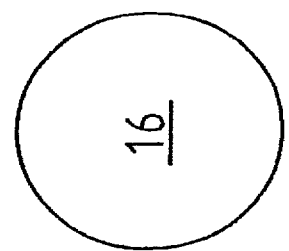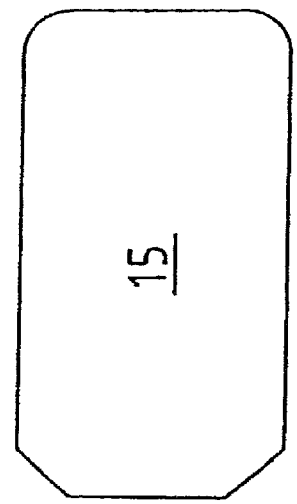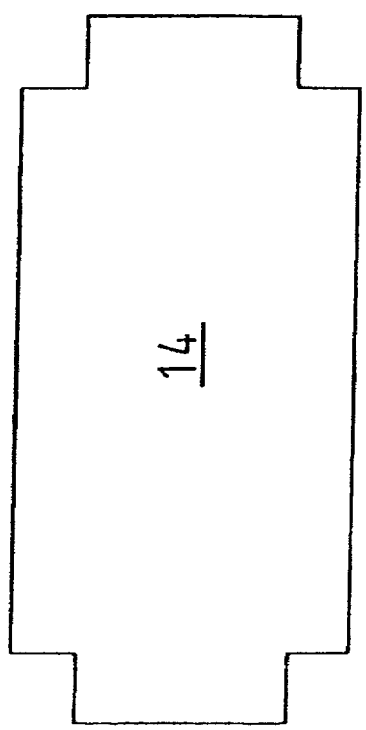
Fig. 4

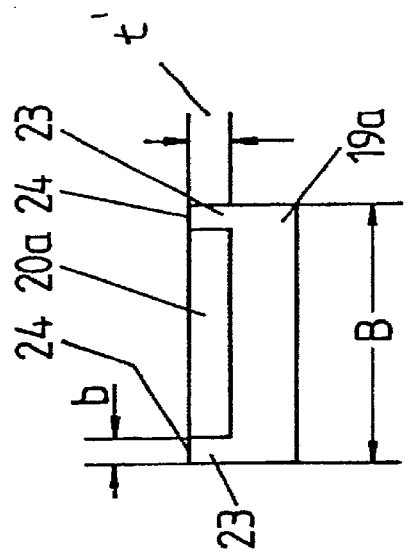
Fig.6
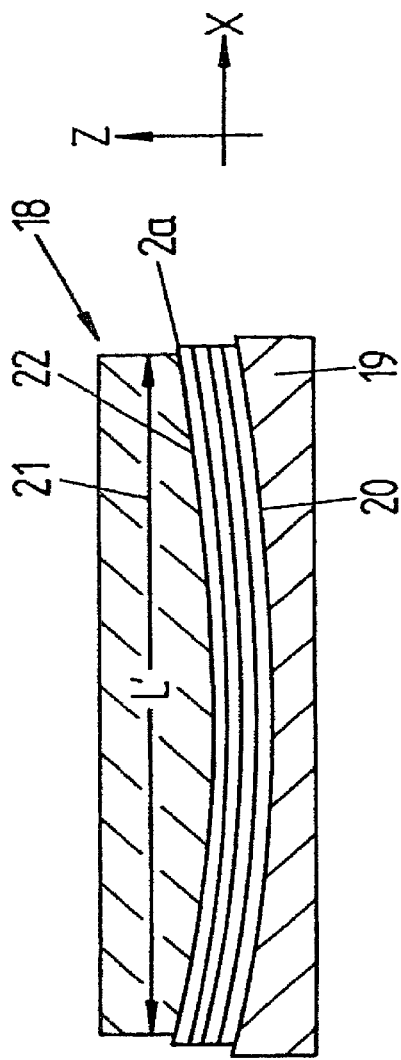
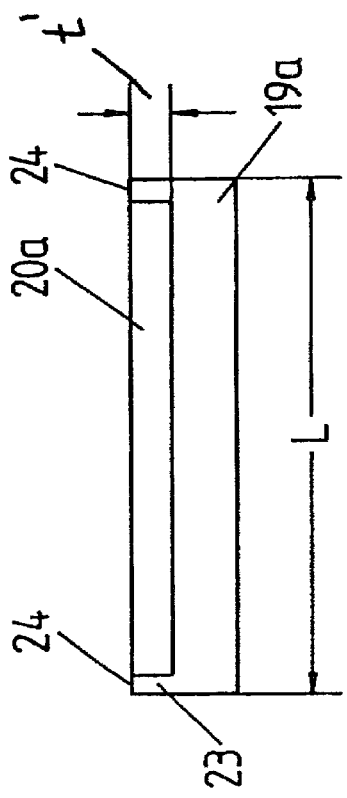
Fig.13
Fig.12

PROCESS FOR THE MANUFACTURING OF AN ARCHED METAL CERAMIC SUBSTRATUM

BACKGROUND OF THE INVENTION

The invention relates to a process for manufacturing a metal ceramic substratum for use as a substrate in electrical or electronic circuits or components.

The metallization required for production for conductor tracks, connections, etc. to be produced on a ceramic, such as, an aluminum-oxide-ceramic, can be accomplished with the DCB process (Direct Copper Bond Technology). This can be accomplished by using metallization—producing metal foils or copper foils or metal/copper sheets, which have on their upper surface sides, a layer or coating (sintering layer) made of a chemical compound of the metal and a reactive gas, preferably oxygen.

In this procedure, as described for example, in the patent specification for U.S. Pat. No. 3,744,120, or German Patent No. DE 2,319,854, this layer or coating (sintering layer) builds up an eutectic mixture, having a fusion temperature lying below the fusion temperature of the metal (such as copper), so that by placing the foil on the ceramic and by heating up all the layers, these layers can be joined with one another. Fusion of the metal or copper only takes place in the region of the fusion layer or oxide layer.

This DCB process includes the following procedural steps:

Oxidation of a copper-foil in such manner, that there results an uniform copper oxide layer.

Layering of the copper foil on the ceramic layer.

Heating up of the composite block to a process—temperature lying between 1065° C. and 1085° C., such as about 1071° C.

Cooling down to room temperature.

An arched substratum and its manufacture (see EP 0,279,601) are known. In the known case, the metal layer on the concavely arched upper side of the ceramic layer has a distinctly larger thickness than the convexly-arched bottom side of the substratum. This structure is necessary in the known case, because the arching of the substratum is achieved during the cooling down period after the DCB process, with which the two metallizations are to be fixed upon the ceramic layer or the ceramic plate. Because the metallization on the upper side has a larger thickness and hence a larger volume, the thermally conditioned tensions, on the upper side, are larger, compared to that on the bottom side, so that the substratum is arched, in the manner mentioned before, during the cooling down period. A disadvantage, here, amongst others, is that this 'bi-metal'0 effect is reversible, i.e., during heating up there occurs a rebending or re-arching of the substratum. During use of this known substratum for power components, the contact pressure, (as conditioned by the arching) between the bottom side of the substratum and a cooling body, is reduced by increasing the heating, that is, just then, for achieving a particularly low heat resistance, a high contact pressure is necessary between the substratum and the cooling body, it is reduced by heating up of the substratum. Moreover, the bending strength of the known arched substratum is not satisfactory either.

It is an object of the invention to produce a process, with which arched metal-ceramic substratum, can be manufactured without any problem, particularly with the same thickness of metallizations, on the upper and bottom side.

SUMMARY OF THE INVENTION

The metal ceramic substratum as manufactured by the process of the present invention, is suitable for an electrical or an electronic power switching network or module and has improved temperature independent heat dissipation, as compared to known arched substrata.

The process, according to the invention, provides for the manufacture of a pre-arched ceramic plate, from a plane or a plane or plane blank plate. In a further step of the process, a metallization is positioned on this pre-arched ceramic plate.

By the curvature of the substratum, or of the ceramic layer, it is possible to bend it elastically in such a manner so that the substratum, on account of the elastic tension of the ceramic layer, lies compactly and securely against a surface of a heat-dissipating metal plate and thereby provides an improved heat dissipation. This occurs even with the use of a cooling paste between the substratum and the metal plate. The curvature of the substrate particularly serves the purpose of an optimum placing of the bottom side or of the bottom metallization of the substratum, for example, against a metal plate and hence, ensures an optimum possible heat transfer between this substratum and a metal plate, building a cooling plate, for example. This improved compounding between the substratum and the metal plate, on account of the pre-arching of the substratum, should remain practically constant, independent of the temperature of the substratum or the metal plate. This demand is no longer fulfilled, when one of the two metal layers has a greater thickness, because the metallization with larger thickness, and hence with larger volume, exercises changing tensions on the relevant surface side of the ceramic layer, depending on temperature, in case of temperature changes. Varying thicknesses of the two metallizations on the upper and bottom side would lead to extra curvature of the substratum, depending on the temperature.

With the degree of curvature, as provided for by the invention, breaking of the ceramic layer is prevented.

In the following, the invention is explained in details, with the help of figures, for a form of construction.

BRIEF DESCRIPTION OF THE DRAWINGS

FIG. 1 shows in simplified representation and inside view, a substratum according to the invention, along with metal plate arranged under the substratum;

FIG. 2 shows a top view on the substratum as depicted in the FIG. 1;

FIG. 3 shows an enlarged detailed representation, a section through the edge of the substratum, chucked in a housing;

FIG. 4 shows in top view, various forms of a substratum, as per inventions;

FIG. 6 shows in simplified representation, a sinter form along with a stack of ceramic plates and a tension plate placed upon this stack during forming or bending of the ceramic plates;

FIGS. 12 and 13 show sections corresponding to the lines III-II or IV-IV of the FIG. 11.

DETAILED DESCRIPTION OF THE INVENTION

Figure 5:
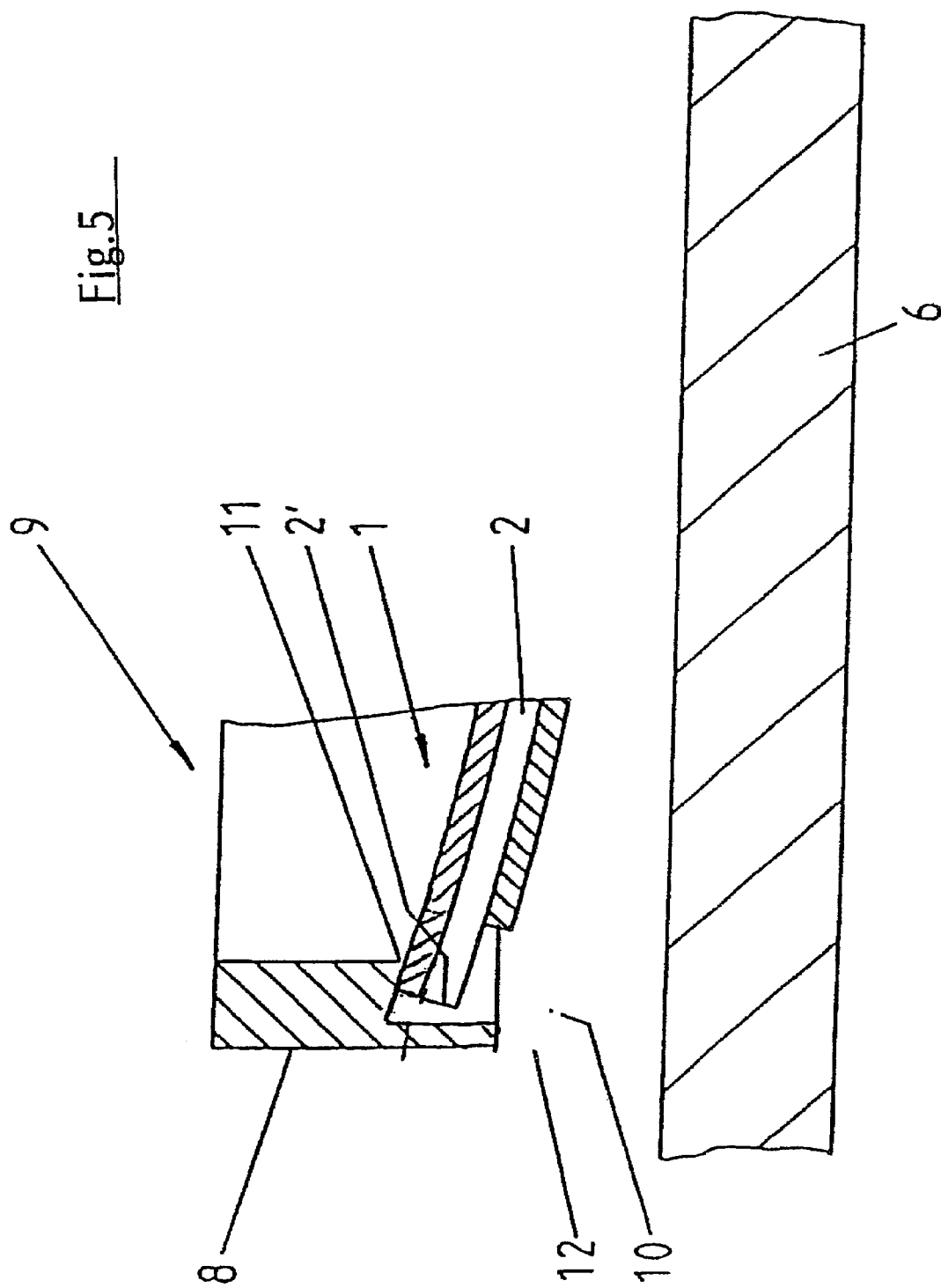
FIG. 5 shows a similar representation as in FIG. 3, but having a further form of construction.

The substratum 1, as depicted in the figures includes a ceramic layer or a ceramic plate 2 which, for example, is an aluminum-oxide-ceramic, and which is provided on the two surface sides, respectively, with a metallization 3 or 4. The metallizations 3 and 4, are respectively built up of a copper foil, which, with the help of the DCB technique, is joined up, surface to surface, with the ceramic layer 2. The metallizations have the same thickness.

In the represented form of construction, the ceramic layer 2, in top view, has a rectangular blank with a longer longitudinal axis L and a shorter cross axis Q at right angles to this. The ceramic layer 2, in the depicted form of constructions, is arched or curved round an axis parallel to the transverse axis, so that the upper side of the ceramic layer 2 is concave and the bottom side is convex. The metallizations 3 and 4 are arched in the same way.

The axis of curvature in FIG. 1 is indicated with Q', it has, however, a considerably larger distance from the substratum 1, than is depicted in this figure. The metallization 3 on the upper side is structured and builds up conductor tracks, as contact surfaces, for soldering of electronic components 5. The metallization 4 on the bottom side is built up in a continuous manner.

The curvature of the ceramic layer 2 is such that, when the substratum with the bottom metallization 4, lies on a plane surface, such as on the upper side of a plane metal plate 6, in the center between the two transverse sides 2', at right angles to the longitudinal axis L and parallel to the curvature axis Q', the bottom side of the ceramic layer 2 on each transverse side 2, has a distance 'X' from the top side of the metal plate 6. In the form of construction as depicted, this distance 'X' is, for example, about 0.1–0.8% of the length, which the arched ceramic layer 2 has between the sides 2, and actually of the thickness of the bottom metallization.

It has been shown, that the thermal conductivity between the substratum 1 and the metal plate 6, which, for example, is a component of a heated dip or a housing, can be greatly improved. The substratum 1 is placed on a plate 6, provided on its top side with a layer made of a cooling paste 7 and hence pressed, on the short sides 2', on the plate 6, whereby there occurs, on account of the elastic distortion of the ceramic layer 2, a compact positioning of the bottom metallization 4 on the metal plate 6 and an uniform distribution of the cooling paste 7 over the entire region of the surface of the metal plate 6, taken up by the bottom metallization.

In case of a curvature, which lies within the framework of the previously mentioned limits, it is in any case ensured, that the ceramic layer 2, can be bent again in a plane form, without any problem and without any danger of breakage. Breakage does not occur, even in the case when the top metallization 3 provided on the concave side of the ceramic layer is structured and thus, does not build up any continuous metallization in a large part of the upper side of the ceramic layer, but on the contrary, has only short dimensions in the axial direction at right angles to the axis of curvature.

Thus, during rebending of the substratum 1 in the plane form, over the metallization 3, there does not occur any excessively high tensional forces between the ceramic layer 2 and the metallization 3.

FIG. 3 shows the chucking of the substratum 1 on the edge, that is, particularly in the region of the two short sides 2', on the rectangular frame building component 8 of a housing 9, with which the substratum 1 can then be fixed on the component of the plate 6, forming the heat dip, using the cooling paste 7. For the reception of the edge of the substratum 1, the housing component 8 has a folder-like recess 10, which, amongst other thins, builds up a supporting surface 11 for supporting the top side of the ceramic layer 2 in the region of the edge. The folder or supporting surface 11, as the bottom side 12 of the housing component 8, has a curved shape and corresponds to the curvature of the substratum 1 or the ceramic layer 2. The edge or the bottom side 12 lies on the same plate with the bottom side of the metallization 4.

An intermediate layer 13, made of a constant elastic substance, preferably a constant elastic adhesive, is provided between the edge of the ceramic layer 2 and the folder surface 11. In addition to the already described advantage of an improved heat transfer between the substratum 1 and the metal plate 6, there is the advantage that tensions between the substratum 1 and the housing 9 are avoided, particularly during mounting the of substratum 1 on the housing 9. The substratum 1 and the housing 9 are elastically shaped, during fixing up on the metal plate. A further possible structure is shown in FIG. 5. In this structure, the top metallization 3 reaches up to the edge of the ceramic layer 2 and lies against the folder surface 11.

As stated above, it was assumed that the substratum 1 was curved only around the axis Q'. It is also possible that the substratum is designed that it is curved around two mutually perpendicular axes, namely, around the axis Q' parallel to the transverse axis Q and simultaneously, around an axis parallel to the longitudinal axis L and is actually concave on the upper side, around both axes, so that the substratum has, on the bottom side, or on the metallization 4, a convexly curved surface corresponding to a partial surface of a spherical surface.

As stated above, it was further assumed that the substratum has rectangular section, i.e., a rectangular structure as seen in a top view. Other structures can also be thought of for the substratum, as for example, the substratum 14 as depicted on in the FIG. 4, whose structure is obtained form rectangular or quadratic basic form, with projections onto opposite sides or the rectangular substratum 15 with rounded and/or slanting edges and/or a round substratum 16.

In the following, with reference to the FIGS. 6–13, the process and form tools are described by way of the examples, with which the formation or arching or curvature of the ceramic plate 2, particularly before the positioning of the metallizations 3 and 4 forming metal or copper foil, is possible.

EXAMPLE 1

Figure 7:
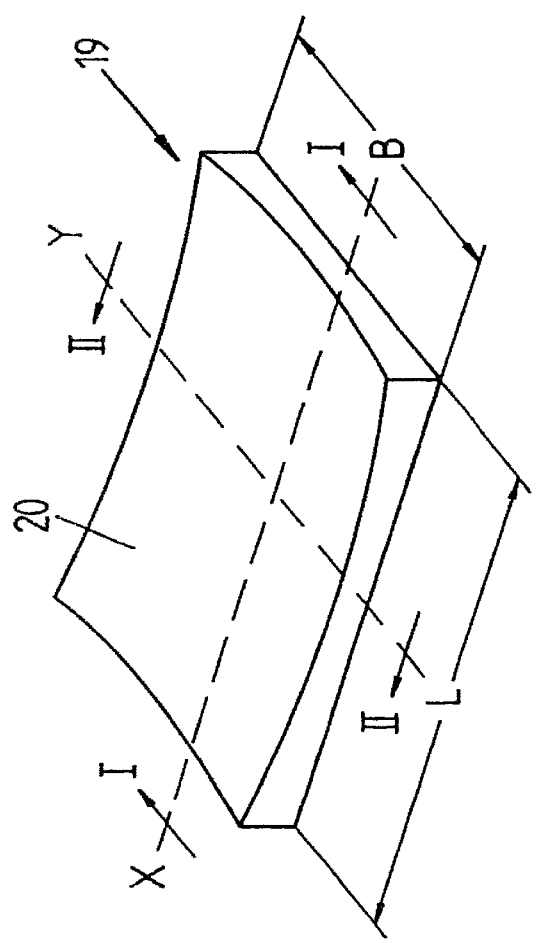
FIG. 7 shows in simplified, perspective, individual representation, the form of sinter plate.
Figure 9:
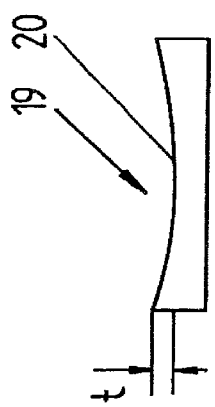
FIGS. 8 and 9 show the form in longitudinal section (sectional line I—I of the FIG. 7) or in cross-section (as per the sectional line II—II of the FIG. 7)
Figure 8:
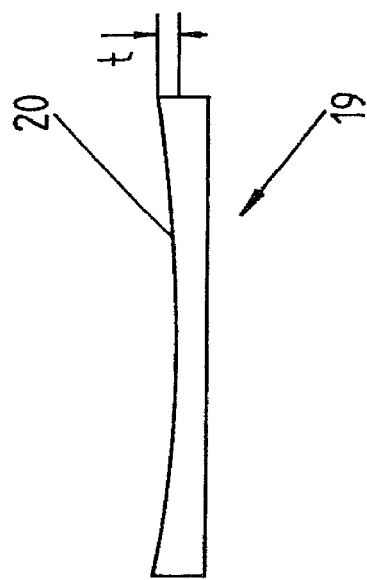
Figure 11:
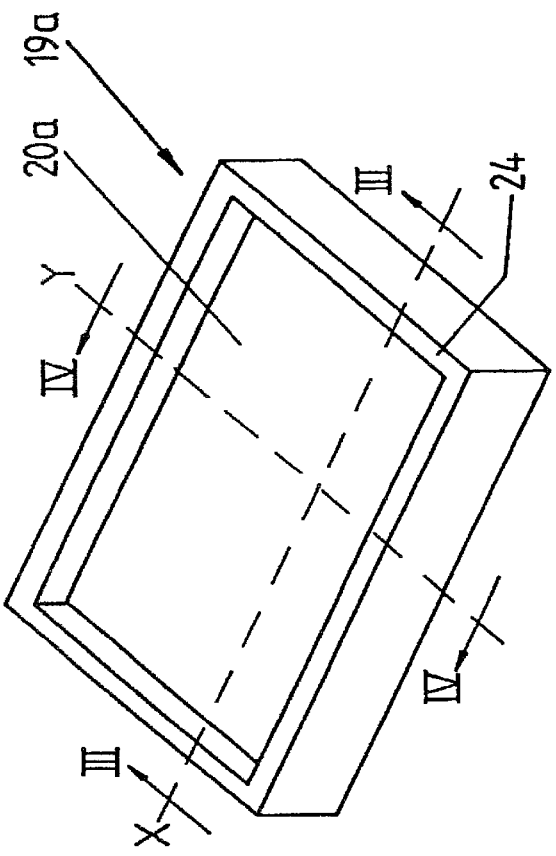
FIG. 11 shows the sinter plate or form plate of the form tool of the FIG. 6 in perspective individual representation.
Figure 10:
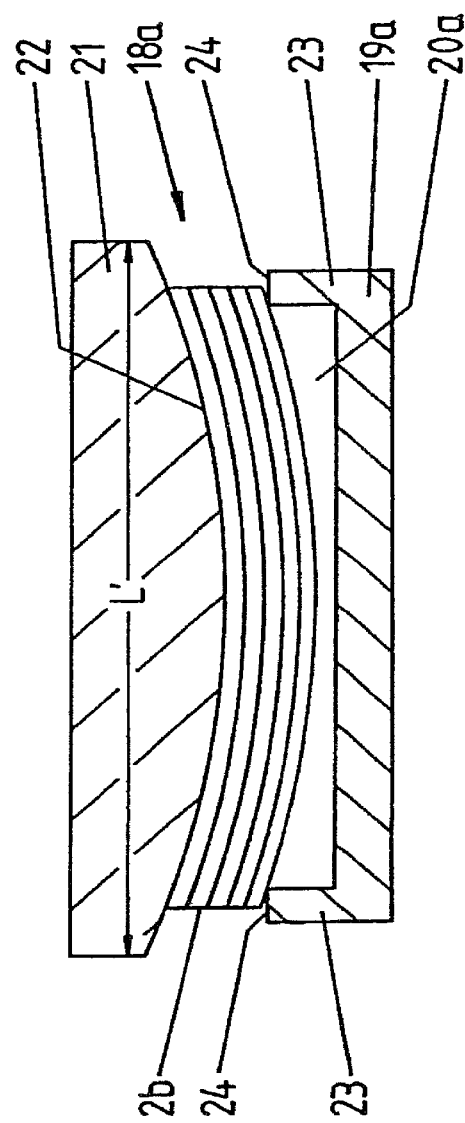
FIG. 10 shows in a representation, similar to that in FIG. 6, a further possible form of the form tool.

In the example, as reproduced in FIGS. 2–9, a form tool 18 is used, which is produced essentially from a sinter plate or form plate 19, from a heat-resistant material, such as silicon carbide (SiC), having a form mold or recess 20 on its upper side, which, in the form depicted, lies around two mutually perpendicular axes, parallel to the longitudinal axis and transverse axis of the form plate 19. As depicted in FIG. 7, the X-axis represents the longitudinal axis and the Y-axis represents the transverse axis. The depth 't' of the form mold 20, in the direction of Z-axis, perpendicular to X-axis and Y-axis, amounts to 0.05–1.5% of the breadth or of the length L. The depth 't' amounts to 1 mm. On the form plate 19 several blank plates 2a, made of green, i.e., non-calcined ceramic, are positioned.

Between the blanks 2a, there is a separating powder, such as corundum powder. The blank plates 2a are, for example, produced from a material by punching, from the green ceramic forming extrusion, or shaped by other means. The dimensions of the blanks 2a are somewhat smaller than the dimensions of the form plate 19. On account of their own weights, the blanks lie one against the other and the lower most blank lies against the surface built up by the form mold 20. At a sufficiently high temperature, such as at 1350° C., the blanks 2a are then sintered or calcined in a normal atmosphere, so that after the burning, the arched ceramic plates 2 are obtained.

The calcined ceramic plates 2 are slowly cooled down to room temperature with a cooling speed or temperature reduction of 3° C. per minute. After the cooling down to the room temperature, the separate, arched ceramic plates 2 are removed and are provided with respective metallizations 3 and 4. For this purpose, on one side of each arched ceramic layer 2, the metallization 3 forming oxidized copper foil with a thickness of 0.3 mm is placed. Finally, there occurs, in a nitrogen atmosphere, with an oxygen component of 35 ppm, a heating up to the temperature 1072° C. The arched ceramic plate and the eutectic mixture, only in the region formed by the copper oxide layer, the smelted copper foil, not lying compactly on this ceramic plate, becoming soft on account of heating, are held at this temperature of 1072° C. for about six minutes. Finally, there occurs a cooling down to the room temperature and the positioning of the metallization on the other surface side of the ceramic plate 2, such as metallization 4, in the same way.

After the positioning of the metallization 4, and the renewed cooling down, there takes place the structuring of at least one metallization with the help of a masking or etching technique, namely, such as that of the metallization 3. For this purpose, an etching mask is positioned on this metallization. Finally, the etching is done with a suitable etching agent, such as $FeCl_3$. After etching the etching mask is removed.

The substratum, thus produced, has metallizations 3 and 4, having the same thickness and, for example, an arching of the size of 0.5–6 mm.

If necessary, on the stack of the blank 2a, a tension plate 21 is positioned, which is made of a temperature-resistant material, for example, a sintering material, such as silicon carbide (SiC). The tension plate builds up on the bottom side or surface 22, whose shape corresponds to the geometry of the form surface of the mold 20. In FIG. 6, this tension plate 21 is depicted in such a manner, that the longitudinal dimension L' is more or less the same as that of the length L of the form plate, where the dimension of the width of the tension plate 21 corresponds to the width B' of the form plate 19. In principle, there is, however, the possibility that the length L and/or the width B' of the tension plate 21 can be different from the length L or the width B, that is, substantially smaller or substantially bigger. Thus, the length L', can lie such as between 0.2–200% of the magnitude of L.

Moreover, in the above statements, it has been assumed that the form mold 20 is curved. On principle, there is, however, the possibility that the surface is formed of a large number of stages, one following the other.

In the foregoing statements, it was also assumed that the curved or arched ceramic plate 2 is arched respectively around two mutually perpendicular spatial axes. It is understood that with the described process, a substratum can be produced which has respectively, a ceramic layer or ceramic plate that is arched or curved only around one spatial axis. In this case, a form tool is used, whose form mold, so is designed to have a concave shape, around only one axial direction, and, for example, as a cylindrical surface and not as a spherical surface.

Moreover, there exists also a possibility to modify the above-described procedure, as follows:

On a form plate, which is designed to have a concave shape around only one axis, the stack of the blank plates 2a are positioned and then, after tensioning with the help of the tension plate 21, in the manner as described before, is sintered or pre-calcined, at a sufficient temperature, such as, at a temperature of about 1350° C. Finally, there occurs a cooling down to room temperature and a positioning of the stack out of the pre-calcined blank plate 1' on a new form plate, which, similar to the representation as in FIG. 9 has a form mold 20, which, for example, is also designed to have a concave shape, around only one axis. After positioning of the blanks, there occurs in a second phase of burning, at a temperature which lies at least about 100° C. under the maximum temperature of the first phase of burning, the final burning or sintering of the blank plates, which are tensioned with the tension plate 21, on the side, away from the form plate. It has been shown that the pre-calcined blanks 2a, during the second phase of burning, change to the shape of ceramic plate 2, which are curved around two mutually perpendicular axes.

After the second phase of burning, there is the cooling down to the room temperature and the subsequent metallization of the individual ceramic plates.

FIGS. 10–13 show a form tool 18a and a process executed with the help of this form tool, for the production of arched ceramic plates 2. The form tool 18a includes a form plate 19a and a tension plate 21. The form plate 19a builds up on its upper side, the concave form mold 20a, which is obtained by means of a recess, which has a constant depth t', limited by a surrounding edge 23 and a plane floor or bottom. The depth t' amounts to about 0.05–1.5% of the length L or width B. In the depicted form of construction, the edge 23 builds up an edge surface surrounding the form mold 20a, having a constant width b, which corresponds to about 0.2–20% of the length L or the width B.

EXAMPLE 2

From the production of the arched thin ceramic plates 2, a stack of blank plates 2b are positioned on the form plate 19a, in such a manner, that the lower most blank 2b, along with its circumferential edge, lies on the edge 23 and, actually, over a width of 3 mm. The stack contains, for example, a total number of 50 blanks 2b, where each blank 2b is a rectangular blank with a length of 150 mm and a width of 100 mm. In case of the blanks 2b, it is concerned with calcined plane ceramic plates ($Al_2O_3$ 96%).

The tension plate 21 is positioned on the stack. Subsequently, the stack is heated up to 1200° C. for about five hours. Finally, there is a cooling down to the room temperature with a cooling speed of about 2° C. per minute.

The cooled down ceramic plates have, in a surprising manner, an arching in two mutually perpendicular spatial axes. Now, there occurs, in a further step of the procedure, the positioning of the metallizations 3 and 4. The positioning of the metallization 3 can occur by positioning of an oxidized copper foil with a thickness of 0.3 mm on the concavely arched top side of the respective pre-arched ceramic plate 2, which is subsequently heated up, together with this copper foil, in a nitrogen atmosphere with an oxygen component of about 35 ppm, up to a temperature of 1072° C. and, for example, it is then hold at this temperature for about six minutes and finally cooled down to the room temperature.

In a next step of the procedure, the positioning of the metallization 4, occurs by using an oxidized copper foil. Subsequently, at least one of the two metallizations, for example, the metallization 3 is structured by means of the masking or etching technique. An etching mask is positioned and the etching is done with the help of a suitable etching agent, such as, $FeCl_3$. Finally, the etching mask is removed.

This process can be modified. The production of the arched ceramic plates can take place in two steps and, for example, one can use a form plate 19a which is similar to what is depicted in FIG. 12. The form plate 19a has an upwardly projecting edge 23 on two oppositely lying sides, so that the blanks 2b lie upon the edges 23 with two oppositely lying edge regions. In the first step of the procedure, the arching is only done around one spatial axis. The blanks, after the first step of the procedure, or after the first heat treatment, are cooled down to room temperature. For the second step of the procedure, the blanks are placed on another form plate, which, similar to the representation depicted in the FIG. 13, has an edge 23 on two oppositely lying sides. The blanks have their other lateral edges lying on the edge 23. In the second step of the procedure, or in the second heat treatment, the heating up of a stack of blanks 2b up to the temperature of about 1200° C. with a heating speed takes place 2° C. per minute. The stack of blanks are held at the temperature of about 1200° C., for a sufficient time period, such as five hours and, thereafter, a slow cooling down occurs with the speed of cooling being about 2° C. per minute.

EXAMPLE 3

The positioning of the metallizations 3 and 4 can take place in a different manner. Metallization occurs by pressing of the arched ceramic plate 2 with a soldering paste, such as one consisting of 40% Ag, 55% Cu and 5% Ti, on both the top and bottom side of the ceramic plate 2. In a subsequent step of the process, the ceramic layer is contacted on both sides with a copper foil, each having a thickness of 0.3 mm. The whole arrangement is heated in a vacuum up to a temperature of about 850° C. The arrangement is held for a sufficient time period, as for example, eight minutes, at this temperature.

Subsequently, a cooling down to room temperature is accomplished. Thereafter, the structuring of at least one metallization takes place in the manner as described above.

Surprisingly, it is shown that the substratum, after this procedure, has a curvature of 0.5–0.6 mm.

EXAMPLE 4

The metallization can also take place by the use of a so-called "soldering foil," as it is described in the patent specification of DE 3,930,859. In the case of a soldering foil, it is oxidized on both sides and is placed between the arched ceramic plate 2 and the copper foil forming the respective metallization. By means of heating the arrangement up to a temperature, as for example, 1072° C. and by holding the arrangement at this temperature, for a sufficient time period (such as six minutes) there occurs, by means of smelting of the soldering foil, a jointing of the copper foil with the ceramic. The metallization, by the use of the soldering foil and the copper foil forming the metallizations, can take place here, again, in two consecutive steps, and the production of the metallization 3 occurs on one side, the production of the metallization 4 occurs on the other side.

In principle, there exists a possibility to use a form tool 18 or a form plate 19 for the blanks 2b.

Figure 14:
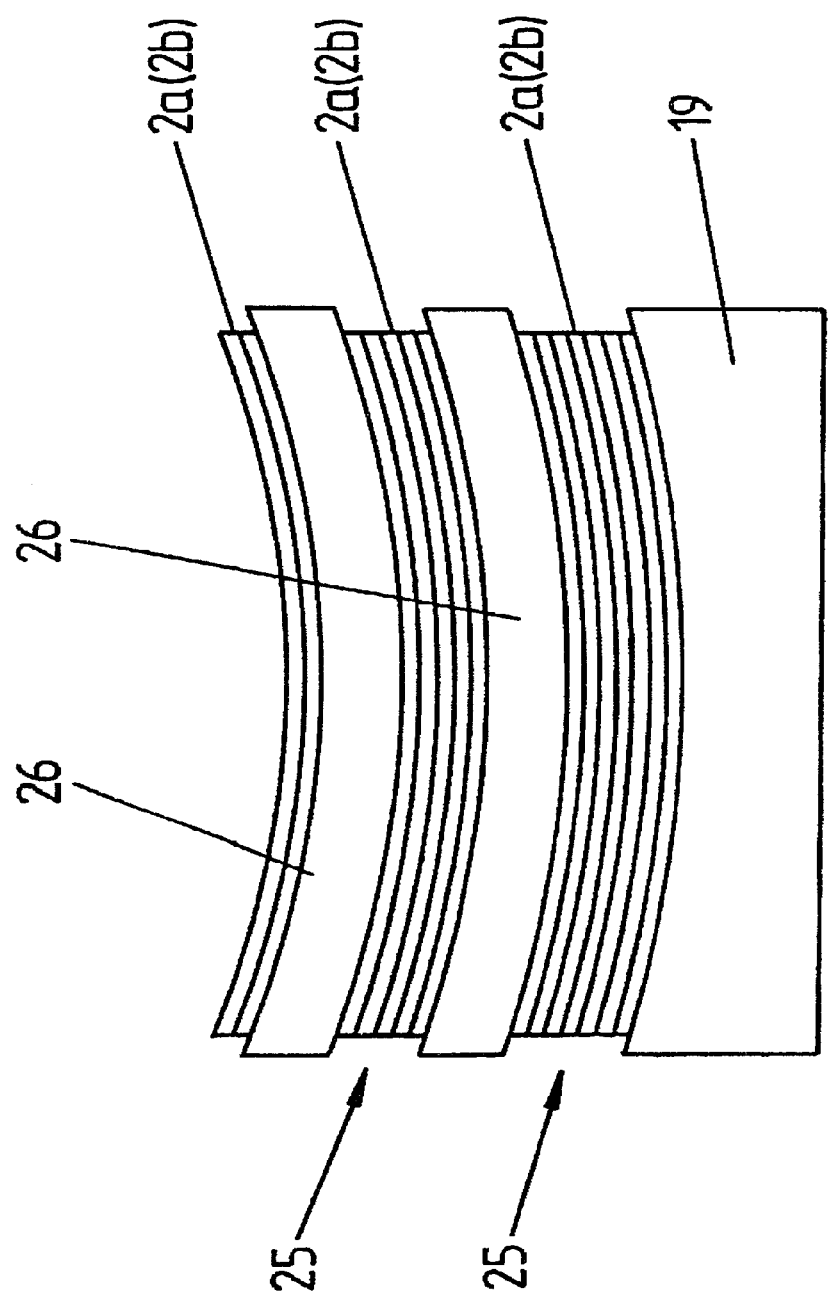
FIG. 14 shows in representation, similar to that in FIG. 6, a further possible form of the form tool.

Another possibility for the production of the arched ceramic plates 2, from the blanks 2a or 2b, is depicted in the FIG. 14. A form plate 19 is used over there, on which a first stack 25, of the blanks 2a or 2b is positioned. On this first stack, there is another form plate or sinter plate 26, which, on its top side of the form surface or form mold, is concavely shaped, corresponding to the form plate 19 and on its bottom side, has a corresponding convex shape. On the form plate 26, there is a second stack of blanks 2a or 2b. On this second stack 25, a second form plate 26 is arranged, on which there is a third stack 25 of blanks 2a or 2b. The form plates 26 are again made of heat-resistant material, namely, sintering material, for example, silicone carbide. With the help of the stack arrangement as depicted in FIG. 14, the number of the arched ceramic plates 2, which can be produced in one single working operation can be increased.

For the form plate 19 or 19a and the tension plate 21, silicon carbide or another material is suitable, which does not get deformed by the heat treatment or by the forces occurring during burning and by the effect of temperatures.

The invention, as state above, was described with the help of model examples of construction. It is obvious, numerous changes and modifications are possible, without deviating from the basic concept of the invention.

LIST OF REFERENCE SYMBOLS

1 Substratum
2 Ceramic layer
2' Transverse side
2a, 2b Blank
3, 4 Metallization
5 Semi-conductor element
6 Metal plate
7 Cooling paste
8 Housing component
9 Housing
10 Housing folder
11 Folder surface
12 Bottom side
13 Constant elasticity mass
14, 15, 16 Substratum
18, 18a Form tool
19, 19a Form plate
20, 20a Form mold
21 Tension plate
22 Surface
23 Edge
24 Lateral surface
25 Stack
26 Form plate
L, Q, Q' Axis
X Distance
Y Length

What is claimed is:

1. A process for manufacturing an arched metal ceramic substrate for electrical or electronic circuits or components, said arched metal substrate having at least one metallization provided on at least one surface side of a ceramic plate, said process comprising the steps of:
  a) forming at least one arched ceramic plate,
    by placing at least one ceramic plate on a form mold and by heating said at least one ceramic plate to a temperature of about 1200° C.;
    placing an oxidized copper foil on at least one surface side of the ceramic plate and
  b) fixing said oxidized copper foil to said arched ceramic plate by heating the arched ceramic plate and said at least one oxidized copper foil; and
  c) placed on said ceramic plate to a temperature from 1065° C. to about 1085° C. and then cooling to room temperature.

2. The process for manufacturing an arched metal ceramic substratum for electrical or electronic circuits or components as claimed in claim 1, wherein said form mold has a concave shape with two axes intersecting at right angles.

3. The process for manufacturing an arched metal ceramic substratum for electrical or electronic circuits or components as claimed in claim 1, wherein said form mold has a concave arch-shaped surface.

4. The process for manufacturing an arched metal ceramic substratum for electrical or electronic circuits or components as claimed in claim 1, wherein said form mold has defined edges on opposite sides which support an edge of said at least one ceramic plate.

5. The process for manufacturing an arched metal ceramic substratum for electrical or electronic circuits or components as claimed in claim 1, further comprising the step of applying a tension plate onto said at least one ceramic plate on a side opposite said form mold prior to said heating.

6. The process for manufacturing an arched metal ceramic substratum for electrical or electronic circuits or components as claimed in claim 1, wherein a plurality of stacks of said at least one ceramic plates are used, said ceramic plates being reported by form elements having concave upper surfaces and convex lower surfaces.

7. The process for manufacturing an arched metal ceramic substratum for electrical or electronic circuits or components as claimed in claim 1, wherein a depth of the form mold is about 0.05% to about 1.5% of a width or a length of said form mold.

8. The process for manufacturing an arched metal ceramic substratum for electrical or electronic circuits or components as claimed in claim 1, wherein said at least one ceramic plate is a green foil of a non-burnt ceramic.

9. The process for manufacturing an arched metal ceramic substratum for electrical or electronic circuits or components as claimed in claim 1, wherein said at least one ceramic plate is produced by first punching, cutting to a length and then heating said ceramic plate to a desired sintering temperature to form a pre-burnt ceramic plate.

10. The process for manufacturing an arched metal ceramic substratum for electrical or electronic circuits or components as claimed in claim 9, further comprising cooling said pre-burnt ceramic plate to room temperature and then heating said pre-burnt ceramic plate on a second form mold to a temperature about 100° C. below said first sintering temperature.

11. The process for manufacturing an arched metal ceramic substratum for electrical or electronic circuits or components as claimed in claim 9, wherein said sintering temperature ranges from about 1500° C. to about 1650° C.

12. The process for manufacturing an arched metal ceramic substratum for electrical or electronic circuits or components as claimed in claim 1, wherein said at least one ceramic plate is a burnt ceramic.

13. The process for manufacturing an arched metal ceramic substratum for electrical or electronic circuits or components as claimed in claim 1, wherein said heating takes place at a heating up speed of about 2° C. per minute.

14. The process for manufacturing an arched metal ceramic substratum for electrical or electronic circuits or components as claimed in claim 1, wherein said cooling to room temperature takes place at a cooling speed of about 3° C. per minute.

15. The process for manufacturing an arched metal ceramic substratum for electrical or electronic circuits or components as claimed in claim 1, wherein said form mold is silicon carbide or corderite.

16. The process for manufacturing an arched metal ceramic substratum for electrical or electronic circuits or components as claimed in claim 1, wherein said at least one ceramic plate has a thickness ranging from about 0.1 to about 1.5 mm.

17. The process for manufacturing an arched metal ceramic substratum for electrical or electronic circuits or components as claimed in claim 1, wherein said at least one ceramic plate is aluminum oxide ceramic or aluminum nitrite.

18. The process as claimed in claim 1, further comprising the step of: placing a second oxidized copper foil on a second surface side of said ceramic plate and fixing said second surface side at a temperature in the range about 1065° C. to about 1085° C., and then cooling to room temperature.

19. The process for manufacturing an arched metal ceramic substratum for electrical or electronic circuits or components as claimed in claim 18, wherein said first oxidized copper foil and said second oxidized copper foil have a thickness ranging from 0.15 to 1.0 mm.

20. The process according to claim 1, wherein the ceramic plate is subjected to a second heating at a temperature of about 1200° C. for a preselected time period before the step of applying said at least one metallization on said at least one surface side of said arched ceramic plate.

21. The process for manufacturing an arched metal ceramic substratum for electrical or electronic circuits or components as claimed in claim 20, wherein said metallization is positioned on both sides of said substrate with an equal thickness.

22. The process as claimed in claim 1, further comprising heating said at least one ceramic plate to the temperature of about 1200° C. for a time period of about five hours.

23. The process as claimed in claim 20, further comprising subject the ceramic plate to the second heating at a temperature of about 1200° C. for about five hours before the step of applying said at least one metallization on said at least one surface side of said arched ceramic plate.

24. A process for manufacturing an arched metal ceramic substrate for electrical or electronic circuits or components, said arched metal substrate having a metallization, at least on one surface side of a ceramic plate, said process comprising the steps of
  a) forming at least one arched ceramic plate by placing at least one ceramic plate on a form mold and by heating said at least one ceramic plate to a temperature of about 1200° C.;
  b) an applying a soldering paste between a copper foil and at least one surface side of the ceramic plate and heating said ceramic plate and said soldering paste and said copper foil to a liquidation temperature of said solder paste.

25. The process according to claim 24, wherein the ceramic plate is subjected to a second heating at a temperature of about 1200° C., before the step of applying said at least one metallization on said at least one surface side of said arched ceramic plate.

26. The process as claimed in claim 25, further comprising subjecting the ceramic plate to the second heating at a temperature of about 1200° C. for about five hours before the step of applying said at least one metallization on said at least one surface side of said arched ceramic plate.

27. The process for manufacturing an arched metal ceramic substratum for electrical or electronic circuits or components as claimed in claim 24, wherein said s oldering paste comprises about 40% Ag, about 55% Cu and about 5% Ti.

28. The process for manufacturing an arched metal ceramic substratum for electrical or electronic circuits or components as claimed in claim 24, wherein said liquidation temperature ranges from about 750° C. to about 1000° C.

29. The process as claimed in claim 24, wherein said form mold has a concave shape with two axes intersecting at right angles.

30. The process as claimed in claim 24, wherein said form mold has a concave arch-shaped surface.

31. The process as claimed in claim 24, wherein said form mold has defined edges on opposite sides which support an edge of said at least one ceramic plate.

32. The process as claimed in claim 24, further comprising the step of applying a tension plate onto said at least one ceramic plate on a side opposite said form mold prior to said heating.

33. The process as claimed in claim 24, wherein a stack of a plurality of ceramic plates is used, said ceramic ic plates being reported by form elements having concave upper surfaces and convex lower surfaces.

34. The process as claimed in claim 24, wherein a depth of the form mold is about 0.05% to about 1.5% of a width or a length of said form mold.

35. The process as claimed in claim 24, wherein said at least one ceramic plate is a green foil of an non-burnt ceramic.

36. The process as claimed in claim 24, wherein said at least one ceramic plate is produced by first punching, cutting to a length and then heating said ceramic plate to a desired sintering temperature to form a pre-burnt ceramic plate.

37. The process as claimed in claim 24, wherein said at least one ceramic plate is a burnt ceramic.

38. The process as claimed in claim 24, wherein said heating takes place at a heating up speed of about 2° C. per minute.

39. The process as claimed in claim 24, wherein said at least one ceramic plate has a thickness ranging from about 0.1 to about 1.5 mm.

40. The process as claimed in claim 24, further comprising heating said at least one ceramic plate to the temperature of about 1200° C. for a time period of about five hours.

41. A process for manufacturing an arched metal ceramic substrate for electrical or electronic circuits or components, said arched metal substrate having at least one metallization provided on at least one surface side of a ceramic plate, said process comprising the steps of:
   a) forming at least one arched ceramic plate,
      by placing at least one ceramic plate on a form mold and by heating said at least one ceramic plate to a temperature of about 1200° C.; and
   b) fixing copper foils with an equal thickness on both surface sides of said ceramic plate heating the arched ceramic plate and said oxidized copper foil placed on said ceramic plate to a temperature from 1065° C. to about 1085° C., and then cooling to room temperature.

42. The process as claimed in claim 41, further comprising heating said at least one ceramic plate to the temperature of about 1200° C. for a time period of about five hours.

* * * * *